(12) United States Patent
Stepan et al.

(10) Patent No.: US 11,549,971 B2
(45) Date of Patent: Jan. 10, 2023

(54) MANAGING POWER DISRUPTIONS IN A SENSOR NETWORK

(71) Applicant: SEMICONDUCTOR COMPONENTS INDUSTRIES, LLC, Phoenix, AZ (US)

(72) Inventors: Miroslav Stepan, Orechov (CZ); Marek Hustava, Bratislava (SK); Tomas Suchy, Brno (CZ); Pavel Hartl, Brno (CZ); Petr Kamenicky, Brno (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/176,963

(22) Filed: Feb. 16, 2021

(65) Prior Publication Data

US 2022/0026976 A1    Jan. 27, 2022

Related U.S. Application Data

(60) Provisional application No. 63/057,005, filed on Jul. 27, 2020.

(51) Int. Cl.
*G06F 1/3212* (2019.01)
*G06F 1/3234* (2019.01)
*G06F 1/3287* (2019.01)
*G01R 19/00* (2006.01)
*H03K 5/08* (2006.01)
*H03K 17/082* (2006.01)
*G06F 1/3215* (2019.01)

(52) U.S. Cl.
CPC ....... *G01R 19/0092* (2013.01); *G06F 1/3212* (2013.01); *G06F 1/3215* (2013.01); *G06F 1/3253* (2013.01); *G06F 1/3287* (2013.01); *H03K 5/08* (2013.01); *H03K 17/0828* (2013.01)

(58) Field of Classification Search
CPC .............................. G06F 1/3225; G06F 1/3275
See application file for complete search history.

(56) References Cited

U.S. PATENT DOCUMENTS 7,310,211 B2 * 12/2007 Gruber ............... H03K 17/0822
257/E27.063
2009/0187781 A1 * 7/2009 Gronemeier ............ G06F 1/305
713/340

FOREIGN PATENT DOCUMENTS

WO    2009011898          1/2009
WO    2019120394 A1      6/2019

OTHER PUBLICATIONS

Denso Corporation, Freescale Semiconductor Inc. and TRW Automotive Inc., "DSI3 Bust Standard," Revision 1.00, Feb. 16, 2011, 45 pages.

* cited by examiner

*Primary Examiner* — Kim Huynh
*Assistant Examiner* — Cory A. Latham
(74) *Attorney, Agent, or Firm* — Ramey LLP

(57) ABSTRACT

A sensor device coupled to a communication interface bus, the sensor device enters a low power mode in which some operations of the sensor device are suspended when the sensor device receives insufficient power over the bus, thereby significantly reducing the likelihood that digital components of the sensor device will need to be reset due to an under-voltage condition.

21 Claims, 7 Drawing Sheets

MANAGING POWER DISRUPTIONS IN A SENSOR NETWORK

CROSS-REFERENCE TO RELATED APPLICATIONS

The present application claims priority benefit of U.S. Provisional Application No. 63/057,005, filed Jul. 27, 2020, entitled "Power Bus with Flexible Constant Current Consumption," which is entirely incorporated by reference herein. The present application is related to U.S. application Ser. No. 17/176,926, filed Feb. 16, 2021, entitled ADJUSTABLE LOW CURRENT IN A SENSOR NETWORK, which is entirely incorporated by reference herein.

BACKGROUND

Distributed system interfaces exist which use power bus communication interfaces connected in a 2-wire configuration to one or more drone devices. In some distributed system interfaces such as these, however, attempts to address sudden under-voltages have not been wholly satisfactory. Thus, there is room for improvement in the art.

SUMMARY

One illustrative embodiment of this disclosure is sensor device, comprising: a first sensor pin connected to a system bus; a current supply circuit connected to the first sensor pin, the current supply circuit configured to generate a first current based on a second current received through the first sensor pin; a second sensor pin connected to the system bus and a transmit circuit; a control circuit connected to the first sensor pin and the current supply circuit by a sensor bus and connected to the second sensor pin and the transmit circuit; a third sensor pin connected to a circuit ground by a first capacitor, the first capacitor having a capacitor voltage level; a voltage detection circuit connected to the third sensor pin, the voltage detection circuit configured to detect a voltage at the third sensor pin corresponding to the capacitor voltage level and to transmit an under-voltage signal to the control circuit when the voltage at the third sensor pin falls below a predetermined level; a clamp circuit connected to the current supply circuit and one or more other sensor circuits by the sensor bus, the clamp circuit configured to transmit an overcurrent signal to the control circuit when the first current exceeds a current drawn by the one or more sensor circuits by a predetermined amount and configured to transmit an undercurrent signal to the control circuit when the first current does not exceed the current drawn by the one or more sensor circuits; a low power mode circuit connected to the control circuit by the sensor bus and connected to a CTANK capacitor by a fourth sensor pin, the CTANK capacitor connected to the system bus and circuit ground, wherein the low power mode circuit is configured to sink current from the CTANK capacitor when the low power mode circuit receives an activation signal from the control circuit and to stop sinking current from the CTANK capacitor when the low power mode circuit receives a deactivation signal from control circuit, wherein the control circuit is configured to transmit the activation signal to the low power mode circuit when the control circuit has received the under-voltage signal for a first predetermined length of time.

Another illustrative embodiment of this disclosure is a sensory network, comprising: a master device; and a sensor connected to the master device by a system bus, wherein the master device is configured to provide a supply current over the system bus to power the sensor communicate with the sensor over the system bus by modulating the supply current, and wherein sensor is configured to communicate with the master device over the system bus using voltage modulated signals, and wherein the sensor comprises: a first sensor pin connected to the system bus; a current supply circuit connected to the first sensor pin, the current supply circuit configured to generate a first current based on the supply current received from the master device through the first sensor pin; a second sensor pin connected to the system bus and a transmit circuit; a control circuit connected to the first sensor pin and the current supply circuit by a sensor bus and connected to the second sensor pin and the transmit circuit; a third sensor pin connected to a circuit ground by a first capacitor, the first capacitor having a capacitor voltage level; a voltage detection circuit connected to the third sensor pin, the voltage detection circuit configured to detect a voltage at the third sensor pin corresponding to the capacitor voltage level and to transmit an under-voltage signal to the control circuit when the voltage at the third sensor pin falls below a predetermined level; a clamp circuit connected to the current supply circuit and one or more other sensor circuits by the sensor bus, the clamp circuit configured to transmit an overcurrent signal to the control circuit when the first current exceeds a current drawn by the one or more sensor circuits by a predetermined amount and configured to transmit an undercurrent signal to the control circuit when the first current does not exceed the current drawn by the one or more sensor circuits; a low power mode circuit connected to the control circuit by the sensor bus and connected to a CTANK capacitor by a fourth sensor pin, the CTANK capacitor connected to the system bus and circuit ground, wherein the low power mode circuit is configured to sink current from the CTANK capacitor when the low power mode circuit receives an activation signal from the control circuit and to stop sinking current from the CTANK capacitor when the low power mode circuit receives a deactivation signal from control circuit, wherein the control circuit is configured to transmit the activation signal to the low power mode circuit when the control circuit has received the under-voltage signal for a first predetermined length of time.

Another embodiment of this disclosure is a method of managing power consumption in a sensor device, comprising: generating a first current using a current supply circuit, the first current based on a second current received through a system bus; detecting a voltage at a sensor pin of the sensor device using a voltage detection circuit, the voltage at the sensor pin corresponding to a capacitor voltage level of a first capacitor; transmitting an under-voltage signal to a control circuit using the voltage detection circuit when the voltage at the sensor pin falls below a predetermined level; transmitting, using the control circuit, an activation signal to a low power mode circuit when the control circuit has received the under-voltage signal for a first predetermined length of time; and sinking current from a CTANK capacitor to power the sensor device, using the low power mode circuit, when the low power mode circuit receives the activation signal from the control circuit.

DETAILED DESCRIPTION

The drawings and corresponding detailed description are provided for explanatory purposes, not to limit the disclosure. To the contrary, the drawings and corresponding detailed description provide the foundation for understanding all modifications, equivalents, and alternatives falling within the scope of the appended claims.

One or more embodiments of this disclosure pertain to power bus communications interfaces. Implementations of power bus communication interfaces may use a distributed system interface, such as a two wire third generation, extended class distributed system interface (DSI3XC). Some implementations of DSI3XC communication interfaces may include a DSI3XC node connected with three wires, where the third wire is a dedicated extra DSI3XC communication wire. These DSI3XC power devices may belong to a DSI3XC signal class. Implementations of DSI3XC communication structures may include a DSI3XC drone connected with two wires. In two wire implementations, the extra current used for sensor (drone) power operations is delivered during a power phase; outside of the power phase the drone device is supplied from a locally mounted CTANK capacitor. In some embodiments, the DSI3XC power phase is used to supply the drone device, or devices, with the desired current of power operations and to charge/re-charge the CTANK capacitor. The CTANK capacitor may be charged to a voltage greater than a low power mode voltage threshold to supply the drone device until the next power phase. In some embodiments, a method of charging/recharging the sensor (drone) node CTANK capacitors is implemented which minimizes current peaks that might otherwise negatively effect on-chip power dissipation. In some embodiments, a sensor (drone) node is supplied continuously from a DSI3XC current source or other power class device. This way, loss of charge from the CTANK capacitor(s) during communication phases is minimized. During power phases, only a small amount of charge is required to replenish the CTANK capacitor(s). At least one technical advantage of this arrangement is that power dissipation is low.

Figure 1:
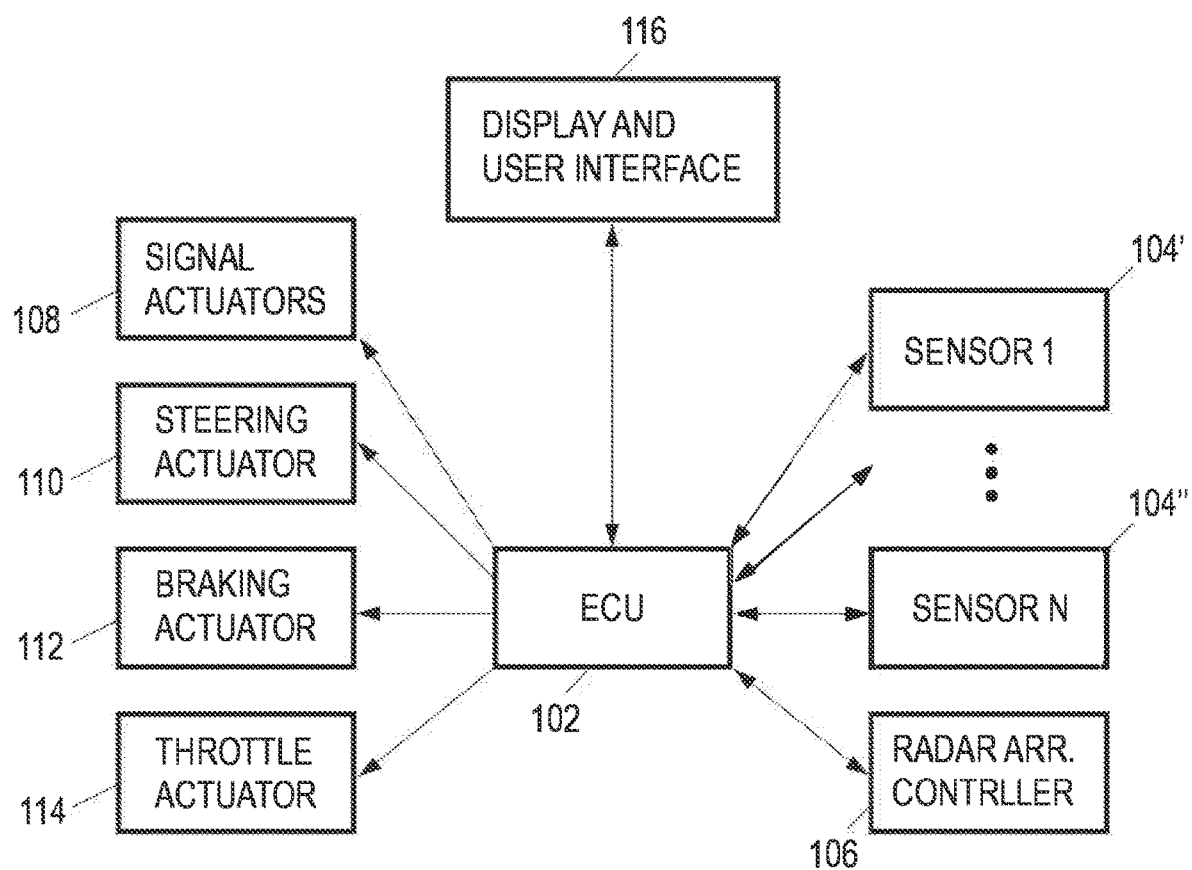
FIG. 1 is a block diagram of a data communication network, in accordance with an example of this disclosure.

FIG. 1 is a block diagram of a data communication network 100, in accordance with an example of this disclosure. FIG. 1 shows an electronic control unit (ECU) 102 coupled to various sensors 104 and an array controller 106 as the center of a star topology. In at least some embodiments of this disclosure, the sensors 104 are ultrasonic sensors which generate and receive ultrasonic waves. Of course, other topologies including serial, parallel, and hierarchical (tree) topologies, are also suitable and contemplated for use in accordance with the principles disclosed herein. The array controller 106 couples to transmit and receive transducers in the transducer array to transmit ultrasonic waves, receive reflections, and determine a spatial relationship of the vehicle to its surroundings. To provide automated parking, assisted parking, lane-change assistance, obstacle and blind-spot detection, autonomous driving, and other desirable features, the ECU 102 may further connect to a set of actuators such as a turn-signal actuator 108, a steering actuator 110, a braking actuator 112, and throttle actuator 114. ECU 102 may further couple to a user-interactive interface 116 to accept user input and provide a display of the various measurements and system status.

Figure 2:
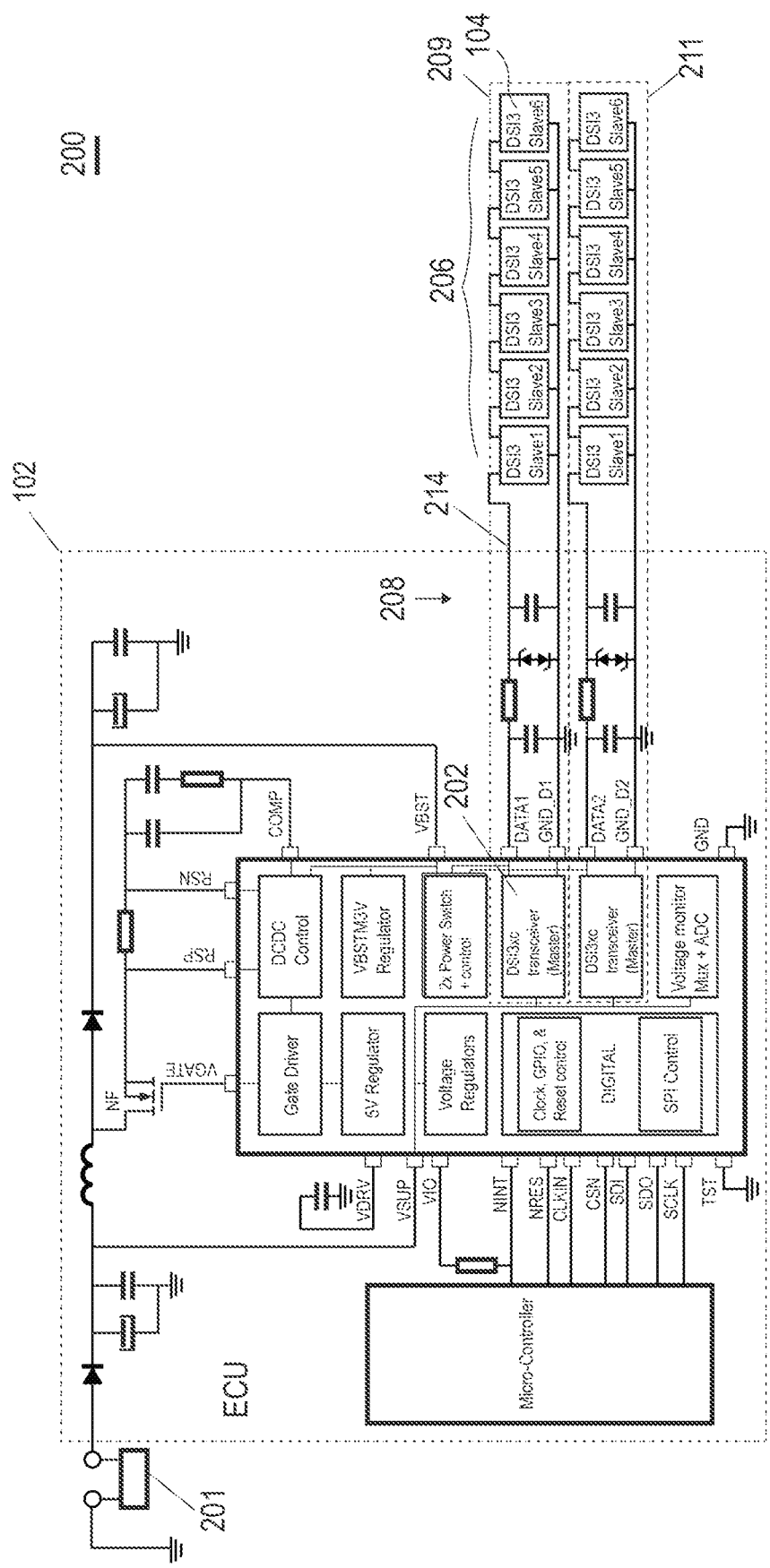
FIG. 2 illustrates a data communication network, in accordance with an example of this disclosure.

FIG. 2 illustrates a data communication network (system) 200 (e.g., 100), in accordance with an example of this disclosure. The data communication network 200 includes an example implementation of a DSI3XC two wire approach using an external (with respect to sensor 104) DC/DC providing supply for a power phase. The system 200 includes an ECU 102 connected to a (car) battery 201 or other suitable constant voltage source. The ECU 102 includes a master (transceiver) 202. The master 202 is coupled to a plurality 206 of sensors (e.g., 104) by a bus structure 208. In at least one example, the bus structure includes a 2-wire connection between the sensors 104 and the master 202. The bus structure 208 includes a bus 214. The bus 214 can be a power bus in a third-generation distributed system interface extended class (DSI3XC) communication wire interface.

The master 202, the plurality 206 of sensors 104, and the bus structure 208 collectively form a sensory network 209. The sensors 104 are connected to the master block 202 in daisy chain fashion. In at least one example of this disclosure, the plurality 206 of sensors of the sensory network 209 are located on or near a bumper of an automotive vehicle, (e.g., a front bumper). As shown, the system 200 can include one or more additional sensory networks 211 operationally similar to sensory network 209.

As will be explained in greater detail, in 2-wire implementations like that illustrated in FIG. 2, drone 104 power operations are at least partially enabled by tank capacitors of the one or more drones 104. These tank capacitors are charged during a power phases and communications phases of the sensory network 209. In some embodiments, during communications phases, these tank capacitors provide current to the sensors 104 when needed. In at least one embodiment of this disclosure, the power and communication phases of the sensory network 209 are interleaved using time divisional multiplexing. drones are supplied by two wires. power and communications phases are interleaved using time multiplexing.

Embodiments of the present disclosure include at least one sensor node 104 that is partially or fully supplied from the bus 214. In at least one embodiment, the bus 214 is a DSI3XC bus. Embodiments may allow flexible constant current consumption by sensor nodes 104 depending on their operation mode after a power phase of a sensory network (e.g., 209) is partially or wholly finished. Embodiments may implement current consumption tracking by one or more sensor nodes 104 in the sensor node(s) 104 or in a master node (e.g., 202). This current consumption tracking may avoid misinterpretation of current changes at the master node 202 with sensor-to-master communication. Some embodiments may operate sensor nodes 104 with low constant current consumption by nodes 104 outside of the power phase. By operating with low constant current, power efficiency may be improved. Embodiments may reduce duration of the power phase, reduce power phase voltage, reduce power dissipation on the master node 202, and/or lower the cost of application packaging. When the system 200 is part of a park assist system (PAS), performance of the PAS may be improved by shortening the PAS repetition time, and/or may reduce master device 202 cost. PAS nodes 104 may be supplied from the DSI3XC BUS 214 with little or no limitation of maximum duration of a measurement phase and/or communication phase of a sensory network 209 at the sensor nodes 104. In some embodiments, the voltage of a DSI3XC bus 214 follows the battery voltage (VBAT) of the system 200, which may reduce power dissipation at the master node 202.

During communications phases of the sensory network 209, components of the sensor nodes 104 detect reflected ultrasonic waves and process data related to the detected ultrasonic waves. The sensor drones 104 communicate with the master 202 by transmitting current modulated signals to the master 202 during communications phases, whereas the master 202 sends voltage modulated signals to the sensor nodes 104.

Figure 3:
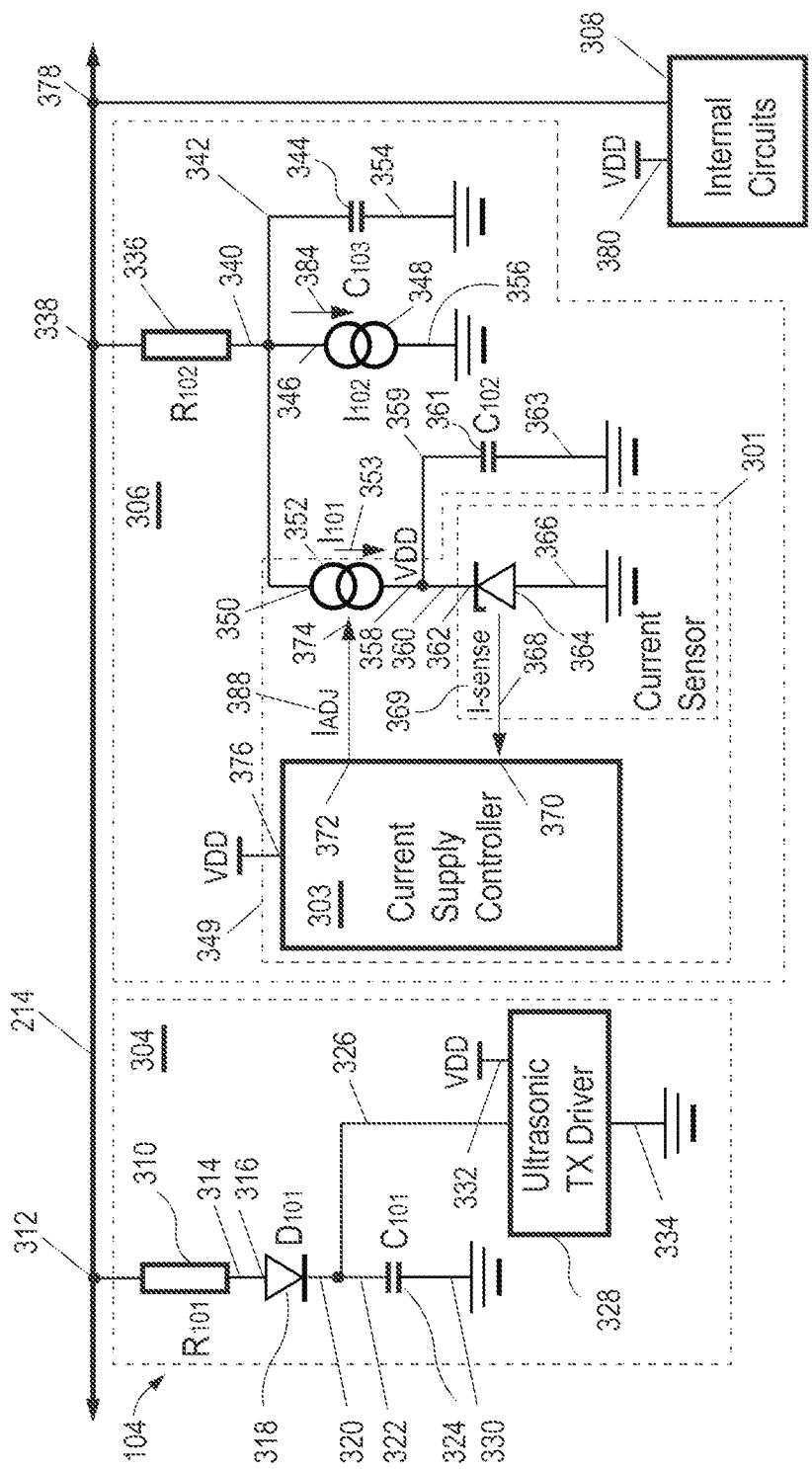
FIG. 3 illustrates components of a sensor connected to a bus, in accordance with an example of this disclosure.

FIG. 3 illustrates components of a sensor (drone) 104 connected to a bus 214, in accordance with an example of this disclosure. FIG. 3 shows an example embodiment of a drone 104 power structure where the drone node 104 is supplied from the DSI3XC bus.

The example of FIG. 3 includes an ultrasonic transmitting (TX) circuit 304, a drone supply circuit 306, and internal drone circuits 308. Some embodiments of the present disclosure may omit the ultrasonic TX circuit 304 and/or the internal drone circuits 308. In other embodiments, the sensor 104 includes a transmitter circuit 304, a supply circuit 306, and a plurality of internal circuits 308, as shown.

The transmitter circuit 304 includes a first resistor 310 (R-101) whose first terminal 312 is connected to the bus 214 and whose second terminal 314 is connected to a first terminal 316 of a forward biased diode 318 (D-101). The second terminal 320 of the forward biased diode 318 is connected to a first terminal 322 of a first (CTANK) capacitor 324 (C-101) and a first terminal 326 of a transmitter driver circuit 328. In at least one embodiment, the CTANK capacitor 324 is a 100-microfarad capacitor to be used outside of the power phase of a sensory network (e.g., 209) to supply the sensor 104. In some implementations, the CTANK capacitor 324 is discharged from 22 volts down to 6 volts during a receive operation of a communications phase of the sensory network 209. The second terminal 330 of the tank capacitor 324 is connected to ground. The transmitter driver circuit 328 has a second terminal 332 connected to a supply (operating) voltage (VDD) and a third terminal connected 334 to ground.

The supply circuit 306 includes a voltage clamp 301 (with a current sensor) and a control circuit (controller) 303. The supply circuit 306 includes a second resistor 336 (R-102) whose first terminal 338 is connected to the bus 214 and whose second terminal 340 is connected to a first terminal 342 of a second capacitor 344 (C-103), connected to a first terminal 346 of a first current source 348 (I-202), and a first terminal 350 of a second current source 352 (I-101). The current source 352 is configured to receive a supply current from bus 214. Voltage clamp 301 can sink any redundant current resulting from the difference of actual current supply demand and the current delivered by current source 352. Based on the current control signal 388 from controller 303, the current source 352 generates an adjustable current 353 which emanates from terminal 358. The second terminal 354 of the second capacitor 344 and the second terminal 356 of the first current source 348 are connected to ground. The current source 352 is connected at a second terminal 358 to an input terminal 360 of the voltage clamp 301 and connected to a first terminal 359 of a third capacitor 361 (C-102); the third capacitor 361 (C-102) has a second terminal 363 which is connected to ground.

Returning to discussion of the voltage clamp 301, in some embodiments, the input terminal 360 of the voltage clamp 301 corresponds to a first terminal 362 of a voltage regulator 364. In at least one embodiment, the voltage regulator 364 comprises a Zener diode whose cathode terminal (362) is connected to the second terminal 358 of the second current source 352 and whose anode terminal 366 is connected to ground. The voltage clamp 301 includes an output terminal 368 which is connected to an input terminal 370 of the control circuit 303. The control circuit 303 has an output terminal connected 372 to an input terminal 374 of the second current source 352. The control circuit 303 has a third terminal connected to the supply (operating) voltage (VDD). The plurality of internal circuits 308 is connected at a first terminal 378 to the bus 214 and connected at a second terminal 380 to the supply (operating) voltage.

As noted, the second current source 352 has a second terminal 358 which is connected to capacitor 361 and to the first input terminal 360 of a current sensor circuit 301. The current sensor circuit 301 includes a voltage regulator 364 whose first terminal 362 corresponds to the first input terminal 360 of the voltage clamp 301 and whose second terminal 366 is connected to ground.

In some embodiments of the present disclosure, the voltage clamp 301 is a shunt current sensor; however, in other embodiments different types of voltage clamps 301 may be used. Current source 352 (I-101) may drive a supply current 353. Current source 348 (I-102) may drive a transmitting current 384. Supply current 353 is also used to charge capacitor 361 (C-102) to the operating voltage VDD. It will be understood by those of skill that operating voltage VDD is the operating voltage for drone 104. In broader sense, supply current 353 supplies all the circuitry connected to VDD. The voltage clamp 301 senses current consumed by the drone 104 and provides a current sense signal 369 (I-Sense) to the control circuit 303. The current supply controller 303 receives signal 369 and provides an adjustment signal 388 (I-ADJ) to adjust the magnitude of supply current 353 provided by current source 352 (I-101). In at least one embodiment, the current supply controller 303 may automatically adjust the magnitude of supply current 353 in response to signal 369 (I-Sense). In at least one embodiment, voltage clamp 301 senses the difference of actual drone current supply demand (represented by the plurality of VDD nodes) and the current delivered by current source 352. This difference is compared with the target level, and based on the result, the correction signal 369 is generated. As noted, voltage clamp 301, current source 352, and controller 303 form a regulation loop circuitry controlling the current (e.g., 353) supplying the drone circuit.

The ultrasonic TX circuit 304 may include resistor 310 (R-101), diode 318 (D-101), CTANK capacitor 324 (C-101), and ultrasonic TX driver 328. The ultrasonic TX driver 328 may be supplied by operating voltage VDD from the drone supply circuit 306.

As noted, the drone 104 may include additional internal drone circuits 308. These circuits 308 may receive information from the DSI3XC bus 214 during a communications phase of the sensory network 209. In some embodiments these circuits 308 may be supplied by operating voltage VDD from the drone supply circuit 306.

The drone device 104 is supplied via local current source 352 (I-101). Current source 352 supplies operating voltage VDD, which is regulated to a given voltage domain, (e.g., 5 volts). Current 353 is distributed amongst various components of the sensor 104 based on need. At least some of this current 353 flows through internal current shunt circuit 301.

The flow of excess current is reported to the digital current supply control circuit 303 as signal 369. When excess current flows to the shunt circuit 301, the control circuit 303 emits an adjustment signal 388 which causes current source 352 (I-101) to decrease its current output. The Current source 352, the shunt circuit 301 and the control circuit 303 form a regulation loop 349 which locks the current output by current source 352 to the minimum needed for the drone node 104 to perform properly; the amount of current coming from current source 352 is adjusted according to the actual needs of the supply circuit 306 and/or the drone node 104.

In accordance with one or more embodiments, the rate at which the current 353 from the current source 352 changes is adjusted slowly. By avoiding current peaks, communications across the bus 214 are not impaired.

In at least one example of this disclosure, operational voltage (VDD) corresponds to a low voltage supply and represents a low voltage supply net that supplies power to the circuits of the drone node 104. The 'net' draws current from the master 202 through bus 214 during the power phase and the communications phase and supplies current to various components of the node 104. This arrangement obviates the need for the components to draw excessive current through the bus 214 during the power phase. In at least one example, current to supply circuit 306 is continuously sank from bus 214 in the communications phase.

In one or more examples of this disclosure, the amount of current necessary to operate a given component varies during an operational cycle of a sensory network 209. The amount of current drawn from the CTANK capacitor 324 is balanced and stabilized by current source 352 (and the regulation loop comprising current source 352). By managing the amount of current drawn from capacitor 324 during the communications phase, the need to substantially replenish the capacitor 324 (e.g., during the power phase) during the power phase is avoided. Furthermore, managing the amount of current drawn from capacitor 324 during the communications phase also means that current to power components of the drone 104 often does not need to be transmitted over the bus 214 during the communications phase, which would undesirably impair the quality of communications between the master 202 and the sensors 104. In some embodiments, there is virtually no current path from bus 214 to CTANK capacitor 324 in the communications phase due to the reverse biased diode 318 insofar as bus 214 has a lower voltage level than CTANK capacitor 324. As will be explained in greater detail, there can be times when, for various reasons (e.g., environmental factors), the amount of voltage delivered by the master 202 falls in a manner that does not correspond to the voltage modulated signals sent from the master 202 to the drones 104 and is below the voltage that is delivered to power one or more of the drones 104 (e.g., under-voltage). It will be noted that although aspects of this disclosure pertain to under-voltage in automotive environments, the teachings of this disclosure can be applied in other situations in which voltage modulated signals are used. In automotive environments, under-voltages could occur during engine startup or be caused by connector micro cuts within one or more drones 104. As noted, aspects of this disclosure are directed to managing operations of one or more drones 104 to mitigate the impact of such under-voltage situations.

Figure 4:
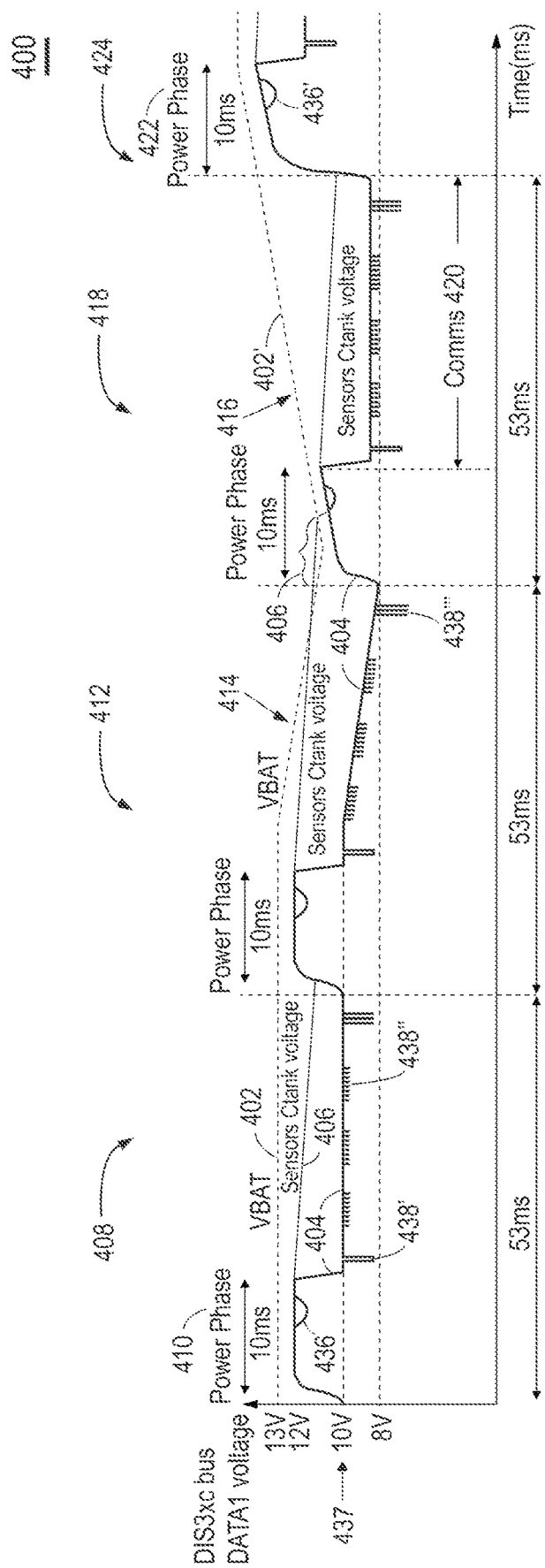
FIG. 4 is a timing diagram corresponding to operational cycles of a sensor, in accordance with an example of this disclosure.

FIG. 4 illustrates a plot 400 of voltage conditions during four operational cycles of a sensory network 209, in accordance with an example of this disclosure. A first line 402 represents a battery voltage or other (substantially) constant power source. A second line 404 represents a voltage across bus 214 between a master node 202 and one or more sensors 104 over multiple operational cycles. When the sensor nodes 104 emit ultrasonic waves, the voltage at the resistor 310 can be caused to (temporarily) drop, corresponding to the concave portions 436 of bus voltage 404. In at least one example, the bus 214 is a DSI3XC bus that follows the VBAT level 402. In some embodiments, having the bus 214 voltage 404 follow the battery voltage 402 reduces power dissipation at the master device 202. By reducing power dissipation at the master device 202, heat generated by the master device 202 can also be reduced. As batteries age, sometimes their output voltage drops, at least temporarily. In the second operational phase 412 of the sensory network 209, the battery voltage 402 drops 414. However, when VBAT 402 drops 414, the bus 214 voltage 404 follows VBAT 402, allowing enough voltage room for the master block 202 to deliver current to the sensors 104 to compensate. In some embodiments, when VBAT 402 drops below a threshold, (in this example a threshold of approximately 10.5 volts), a DC-DC booster (not shown) is activated. As a result, the bus 214 voltage 404 remains above a predetermined level, (in this example a voltage level of 8 volts). When VBAT increases 416 in the third operational cycle 418, the bus 214 voltage 404 output is shaped like the voltage output of the first operational cycle 408, albeit at a lower average level. Because the voltage 404 remains stable, CTANK diodes (e.g., 318) of the sensory network 209 are not activated, and the accuracy of communications between the sensors 104 and the master block 202 during the communications phase 420 is unimpaired as a result. (It will be understood that the reverse biasing effect of diode 318 minimizes disruptions in data communications with CTANK capacitor C101 (324) and servers to keep voltage 404 below voltage 406 in operational cycle 418.) A primary reason not to raise voltage 404 is to keep diode 318 closed. Notably, at the end of the second operational cycle 412 and the beginning of the third operational cycle in the embodiment illustrated in FIG. 4, the CTANK capacitor voltage exceeds the battery voltage 402. In some embodiments, power dissipation at the master block 202 may briefly exceed a target level (e.g., 1 Watt) when VBAT 402 fluctuates as illustrated in the second operational cycle 412 and the third operational cycle.

As shown in FIG. 4, there are moments when the bus voltage 440 dips 438 below the idle voltage 437 of the bus 214. These dips 438 correspond to voltage modulated signals across the bus 214. Greater dips in magnitude are typically linked to voltage communications (master request), while lesser dips in magnitude are typically linked to the current communication (e.g., drone response). (For example, in the first communications phase 408 the bus voltage 404 drops to nearly 8 volts during two intervals.) However, there can be times when more severe drops could occur (e.g., due to a drop in VBAT voltage 402), such as a drop by 4 volts. If the idle level 437 is 10 volts, as shown in FIG. 4, a drop of 4 volts could cause the instantaneous voltage on the bus 214 to drop to 6 volts. Similarly, if the idle level is 8 volts, a 4-volt declination could cause the instantaneous voltage on the bus 214 to go to 4 volts, which, depending on the power needs of the sensor node 104, could interfere with the ability of the sensor node 104 to operate properly. In more severe cases, data stored by digital components of the sensor node could be lost. In even more severe cases, instructions governing operation of components of one or more sensor nodes 104 could be lost from local (volatile) memory, which would require that the sensor nodes 104 would need to be reset (rebooted) before being able to function properly again.

Aspects of this disclosure are directed to reducing the likelihood of such undesirable results.

Figure 5:
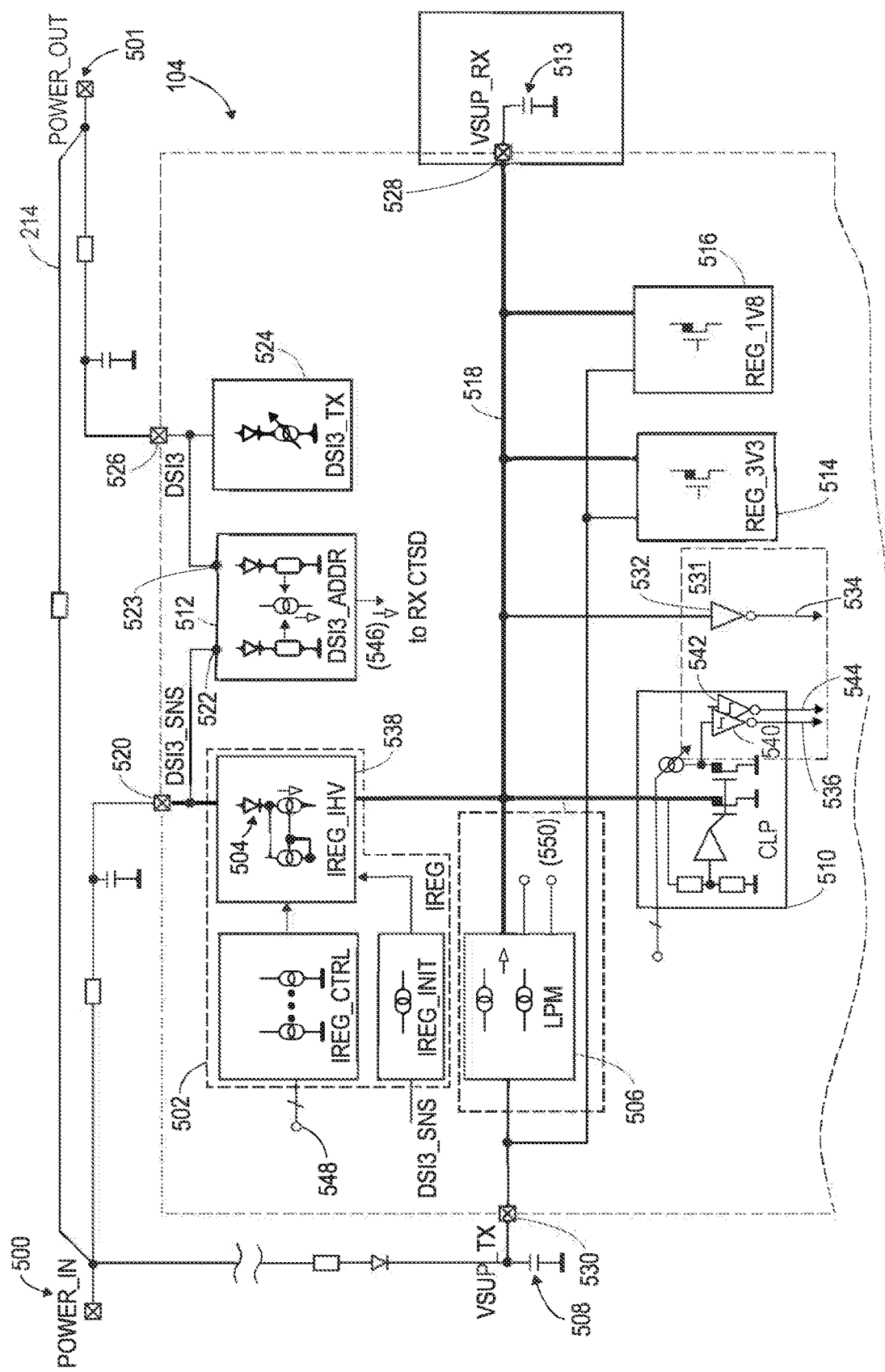
FIG. 5 illustrates components of a sensor connected to a bus, in accordance with an example of this disclosure.

FIG. 5 illustrates components of a sensor node 104 having a low power mode, in accordance with an embodiment of this disclosure. As described above, the sensor node 104 is connected to the master 202 (see FIG. 2) over bus 214. Bus 214 includes a power input pin 500 and a power output pin 501. The node 104 includes a supply circuit 502. The supply circuit 502 can comprise a high voltage current mirror with a reverse protection diode 504, a low voltage digital-to-analog converter (DAC) and startup circuitry (not shown). The sensor 104 also includes a low power mode circuit/power management circuit (PMC) 506. When the sensor 104 is operating in a low power mode, the PMC 506 enables current to be drawn from CTANK capacitor 508. The sensor node 104 also includes a voltage clamp circuit 510. The voltage clamp circuit 510, regulates the voltage level derived from the current 353 and reports the overcurrent or undercurrent to controller 303 (see FIG. 3). The sensor 104 also includes auto addressing detector (AAD) 512 for discovering the node address when the sensor node 104 is in a discovery mode during the power phase (e.g., 410). The sensor node 104 also includes an analog domain voltage regulator circuit 514 for analog functions of the sensor node 104. (For example, ultrasonic receiver and converter from analog to digital domain, oscillator, and others) and a digital domain voltage regulator circuit 516 for digital functions of the sensor node 104. Each of these components is connected to a sensor bus 518 which is connected to first sensor pin 520, which is connected to bus 214. AAD 512 is connected to the sensor bus 518 at a first AAD pin 522. The AAD 512 is also connected to bus 214 and a transmitter circuit 524 (e.g., within circuitry 308) at a second AAD pin 226. The transmitter circuit 524 and the AAD 512 are connected to bus 214 through second sensor pin 526. During normal operations (e.g., master 202 and node 104 are communicating over bus 214), capacitor 513 is charged by current from supply circuit 502 and if an under-voltage condition is detected, current is drawn from capacitor 513 to make up for the reduced current supplied by the supply circuit 502. master 202. If the under-voltage condition is brief, when the brief under-voltage condition ends, capacitor 513 is recharged and operations of the sensor node 104 are unaffected. Thus, short term under-voltage conditions will not affect operations. In at one embodiment, when a minimum steady voltage level is reached on bus 214 (e.g., 8 volts), the supply circuit 502 supplies power to the sensor node 104 from the first sensor pin 520. If the voltage on bus 214 is too low (e.g., falls below 8 volts) to enable the supply circuit 502 to supply the sensor 104, current is drawn from capacitor 513 through third sensor pin 528 to make up for the shortfall. The rate at which the capacitor 513 discharges current depends on the instantaneous amount of charge stored by the capacitor 513 and the rate at which components of the sensor node 104 consume current. In some embodiments, when the voltage at pin 528 falls below a predetermined level (e.g., 4.1 volts), controller 303 (see FIG. 3) switches the sensor node 104 into a low power mode in which some functions of the sensor 104 are curtailed. In some examples, when the sensor 104 is in a low power mode (LPM), the sensor 104 stops transmitting information to the master 202. In some variations of the LPM, such information is stored in memory (for subsequent transmission when the sensor switches back to the normal mode from the LPM).

In some embodiments, the PMC 506 comprises one or more programmable high voltage current mirrors which are activated in accordance with their programming in light of the amount of current coming from supply circuit 502.

When voltage clamp circuit 510 detects overcurrent from the supply circuit 502, the voltage clamp circuit 510 reports the overcurrent condition to controller 303. When controller 303 determines that overcurrent has been present for a sufficient lengthy of time, controller 303 will return the sensor 104 to normal operation. In other words, the abundance of supply current is reported as overcurrent from voltage clamp circuit 510. In at least one embodiment, the voltage clamp circuit 510 comprises a shunt current sense circuit.

In accordance with one or more examples of this disclosure, capacitor 513 is charged during normal operation (when node 104 is supplied from sensor pin 520) by excess current from supply circuit 502. In at least one embodiment, the sensor node 104 is an application-specific integrated circuit (ASIC). Supply circuit 502 is configured to generate higher current than is required for the ASCI 104 to operate. In some examples, the supply circuit 502 is programmable to generate 0.5 milli-amps, 1.0 milli-amps, 1.5 milli-amps or 2.0 milli-amps of excess (surplus) current. In some examples, the supply circuit is programmable to generate overcurrent from 0.5 milli-amps to 4 milli-amps in 0.5 milli-amp increments. In some examples, the supply circuit 502 is programmable to generate the maximum current demand of the sensor 104 plus some amount of current flowing through shunt clamp 510. In some examples, supply circuit 502 delivers a maximum of 13 milli-amps in increments of 100 micro-amps. In some embodiments, clamp circuit 510 will minimize the amount of excess current delivered by the supply circuit 502, and any remaining excess current will be dissipated by the ASIC 104.

In some examples, capacitor 513 is used to filter bus voltage drops below approximately 8 volts during regular master-to-node communications. In at least one example, if the voltage at the third sensor pin 528 drops below approximately 4 volts for longer than approximately 8 microseconds, the PMC 506 is activated and the sensor 104 will draw current from CTANK capacitor 508 through a fourth sensor pin 530. Fourth sensor pin 530 is connected to CTANK capacitor 508, system bus 214, and sensor bus 518. Current from CTANK capacitor 508 thus serves—so long as the sensor 104 is able to draw current from the CTANK capacitor 508—to prevent the sensor 104 from needing to reset, despite the fact that the voltage at the first sensor pin 520 has fallen below the voltage on sensor bus 518 (approximately) 5 volts for longer than (approximately) 200 microseconds. It will be understood by those of skill in the art that, depending on the need of a given node 104 for current and the (size) capacity of the CTANK capacitor 508, other values are possible.

In at least one embodiment, the low power mode (LPM) of the sensor 104 is initiated by voltage monitor circuit 532 (of a comparator bank 531) which is connected to capacitor 513 by sensor bus 518 at the third sensor pin 528. When the voltage monitor circuit 532 detects that the voltage level at the third sensor pin 528 is below a predetermined level, the voltage monitor circuit 532 sends a notification signal 534 to controller 303. Thereafter, when the voltage level on system bus 214 returns to its normal level, this return to normalcy will cause the supply circuit 502 to be able to provide additional current to the sensor 104. When the voltage clamp circuit 510 detects that a predetermined amount of excess current (e.g., 0.5 milli-amps) has been present for a predetermined length of time (e.g., 1 microsecond), the voltage clamp circuit 510 will send an overcurrent notification signal 536 to controller 303. In some examples, 4 milli-amps of overcurrent is required for the sensor circuit 104 to leave the low power mode. When the controller 303 receives the overcurrent notification signal 536 from the voltage clamp circuit 510, the controller 303 will send a signal to the PMC 506 to stop drawing current from the CTANK capacitor 508. (The CTANK capacitor 508 will be recharged by the voltage at pin 500.) Thus, the collective operations of the voltage monitor circuit 532, the voltage clamp circuit 510 and the controller 303 work to ensure that current is drawn from the CTANK capacitor 508 during a communications phase of the sensor 104 only to the extent necessary to help ensure that digital components of the sensor 104 do not need to be reset.

In one or more examples of this disclosure, capacitor 513 is a 4.7 microfarad capacitor. In some examples, the CTANK capacitor 508 is a 68-microfarad capacitor.

The supply circuit 502 includes a high voltage current mirror 538 that includes a reverse protection diode 504. As set forth in related application no. 17/176,926 ("Adjustable low current in a sensor network"), the supply circuit 502 continuously supplies current to the sensor 104, even during the communications phase (see also FIG. 4). At least one aspect of this disclosure is directed towards preventing changes in voltage delivered to the supply circuit 502 from being translated into changes of current supplied by the supply circuit 502 which could, in effect, be misinterpreted by the sensor 104 as communication signals from the master 202. During normal operations, the supply circuit 502 supplies all current necessary for the sensor 104 to operate. Current from the supply circuit 502 is delivered to the analog voltage regulator 514 (which in at least one example is a 3.3-volt voltage regulator), which regulates the amount of current delivered to analog components of the sensor 104. Current from the supply circuit 502 is also delivered to the digital voltage regulator 516 (which may be a 1.8-volt voltage regulator), which regulates the amount of current delivered to digital components of the sensor 104. When the current output by the supply circuit 502 exceeds the amount of current drawn from analog voltage regulator 514 and digital voltage regulator 516, the excess current flows to the voltage clamp circuit 510. For example, if the supply circuit 502 sinks 12 milliamps of current from the system bus 214 and the sensor 104 takes 11 milliamps (as dictated by the analog voltage regulator 514 and the digital voltage regulator 516), 1 milliamp will flow to the voltage clamp circuit 510. The current (in this example 1 milliamp) flowing into the voltage clamp circuit 510 is monitored by a first current comparator 540 and a second current comparator 542. The first comparator 540 will output an overcurrent signal 536 when the overcurrent exceeds a first predetermined level (e.g., 0.5 milliamps) and the second comparator 542 will emit an overcurrent signal 544 if overcurrent exceeds 20 milliamps. In some examples, comparator 540 is also able to detect the undercurrent, so in steady state, the redundant current flowing through the shunt clamp 510 is close to an overcurrent threshold set for the shunt clamp 510. In some examples, the overcurrent threshold can be changed dynamically.

During normal operation of the sensor 104, the overcurrent signal 536 will cause the controller 303 to communicate a control signal 546 to control input pin 548 of the supply circuit 502 which will cause the supply circuit 502 to reduce the amount of current the supply circuit 502 delivers by a predetermined incremental amount (e.g., 100 micro-amps). By the same token, during normal operations, if the overcurrent is too low, as determined by comparator 540, the voltage clamp circuit 510 will send signal 544 to the controller 303, which will in turn send a control signal 546 to the supply circuit 502 (at pin 548) to reduce the current being supplied by the supply circuit 502. Recall that if the amount of current delivered by the supply circuit 502 is below the amount necessary for the sensor to function properly (e.g., voltage regulator 514 and voltage regulator 516 require 14 milliamps but the supply circuit 502 is only delivering 13 milliamps) any short-term short fall in the amount of current delivered by the supply circuit 502 will be compensated by current from capacitor 513. In many embodiments of this disclosure, the redundant current (overcurrent) is a small fraction of the current supplied by the supply circuit 502 (e.g., 1/15).

Figure 6:
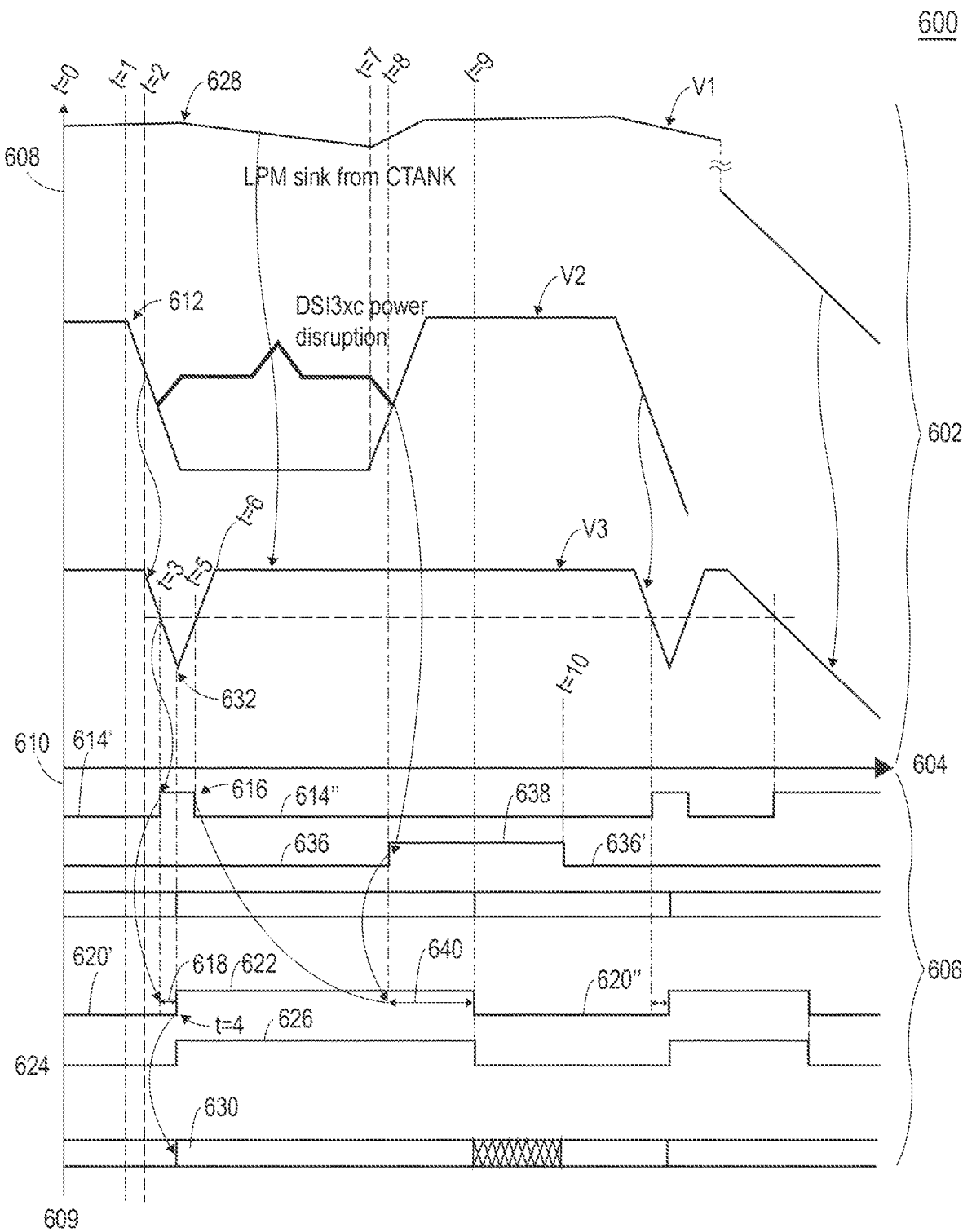
FIG. 6 is a timing diagram corresponding to a sensor entering and exiting a low power mode due to an under-voltage, in accordance with an example of this disclosure.

FIG. 6 is a timing diagram 600 corresponding to functions and voltage levels of sensor 104. Portion 602 of the timing diagram 600 above the horizontal time axis 604 corresponds to voltage levels (along segment 608 of the vertical axis 609) in analog circuits of the sensor 104. Portion 606 below the time axis 604 corresponds to voltage levels and signal outputs of digital components of the sensor 104 (along segment 610 of the vertical axis 609). Voltage level V1 corresponds to the voltage at pin 530. Voltage level V2 corresponds to the voltage at pin 520. Voltage level V3 corresponds to the voltage at pin 528.

At time zero (t=0), CTANK capacitor 508 is fully charged (e.g., to 68 microfarads, during power phase 410, see FIG. 4) and the voltage V1 at sensor pin 530 is at a corresponding predetermined level. The voltage V2 at sensor pin 520 is lower than at sensor pin 530 and corresponds to a suitable operating voltage delivered by system bus 214. The voltage V3 of capacitor 513 is stable at a lower predetermined level (e.g., 5 volts). At time one (t=1) a power disruption 612 occurs and the voltage V2 delivered by the system bus 214 to the sensor 104 begins to fall. After a short delay, the sensor 104, at time two (t=2) begins to draw current from capacitor 513 to make up for the supply circuit's inability to supply sufficient current due to the power disruption 612 at time one, which causes the voltage V3 at sensor pin 528 to begin to fall. At time three (t=3) voltage detection circuit 532 detects that the voltage V3 at sensor pin 528 has fallen below a predetermined level which causes the voltage detection circuit to switch from outputting logic zero 614 to logic one 616 to controller 303 After a time interval 618 of a predetermined length during which controller 303 does not receive a logic zero signal from voltage detection circuit 532 (e.g., the voltage V3 at sensor pin 528 is still lower than desired) controller 303 switches (at time four) from outputting a logic zero 620 to a logic one 622 to PMC 506, meaning that the sensor 104 has switched from its normal power mode to a low power mode. The logic one 622 signal causes the voltage at enable pin 550 of the PMC 506 to switch from logic zero 624 to logic one 626 which causes PMC 506 to begin to draw current from CTANK capacitor 508, and so the voltage of the CTANK capacitor 508 begins to fall 628. As part of its LPM functionality, in addition to activating the PMC 506 to draw current for the sensor from CTANK capacitor 508, at time 4 (t=4) the controller 303 also sends a control signal 630 to pin 548 of the supply circuit 502. When the power disruption 612 ends, supply circuit 502 starts to deliver the maximum current resulting from control signal 630. This maximum current is detected by comparator 540 set at maximum overcurrent threshold (~4 mA) and the lower power mode ends. In at least some embodiments, the controller 303 will cause the sensor 104 to pause sending communications to the master 202.

As noted, the sensor 104 begins to sink current from CTANK capacitor 508 at time four, causing V1 to decline 628. The voltage V3 at sensor pin 528 therefore begins to rise 632, and so at time five (t=5), the voltage detection circuit 532, having detected that the voltage of capacitor 513 has risen to its predetermined minimum value, switches from emitting a logic one signal 616 to a logic zero signal 614". It is worth noting however, that the mere fact that the voltage at pin 528 has been restored to its minimum level does not cause the sensor 104 to exit the LPM. Indeed, even though at time six (t=6) the capacitor 513 is fully recharged, the amount of current being delivered by the system bus 214 to the sensor 104 is still much lower 632 (and in some cases nearly zero) than needed for the sensor 104 to perform all functions.

At time seven (t=7) power is restored and so the voltage at pin 520 begins to increase. Keeping in mind that the sensor 104 is drawing less current than it would if it were operating in the normal mode, the increased current from the supply circuit is soon registered as an overcurrent by clamp circuit 510. The clamp circuit 510 therefore, at time eight (t=8) switches from emitting a logic zero signal 636 to a logic one signal 638. The logic one signal 638 from the clamp circuit 510 causes the PMC 506 to return to emitting a logic zero signal 620 after a debounce period 640. The sensor 104 can therefore stop operating at low power while not drawing current from the CTANK. It is notable that the sensor circuit 104 does not exit the lower power mode (at t=9) until the power disruption has been over for an amount of time (since t=8). Since the sensor circuit 104 stops operating in the low power mode, the clamp circuit 510 soon stops detecting an overcurrent, and so returns to emitting a logic zero signal 636 at time ten (t=10).

Figure 7:
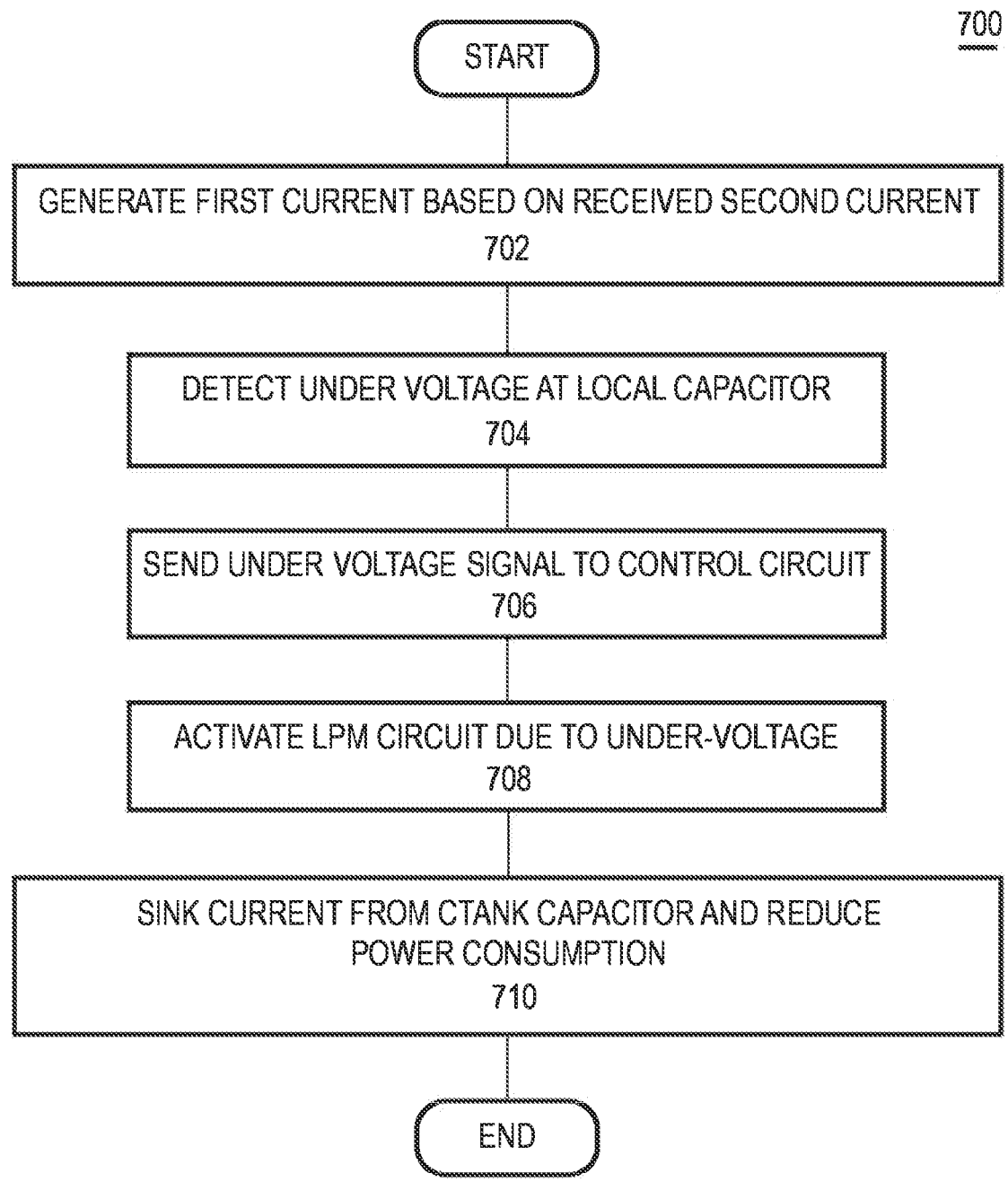
FIG. 7 illustrates a method of operating a sensor node, in accordance with an example of this disclosure.

FIG. 7 illustrates a method 700 of managing power consumption in a sensor device 104. The method 700 comprises generating 702 a first current using a current supply circuit (e.g., 306, 502), the first current based on a second current received through a system bus 214; detecting 704 a voltage at a sensor pin (e.g., 528) of the sensor device using a voltage detection circuit (e.g., 532), the voltage at the sensor pin corresponding to a capacitor voltage level of a first capacitor (e.g., 513); transmitting 706 an under-voltage signal (e.g., 534) to a control circuit 303 using the voltage detection circuit when the voltage at the sensor pin falls below a predetermined level; transmitting 708, using the control circuit 303, an activation signal to a low power mode circuit (e.g., 506) when the control circuit 303 has received the under-voltage signal for a first predetermined length of time; and sinking 710, using the low power mode circuit, current from a CTANK capacitor (e.g., 508) to power the sensor device, when the low power mode circuit receives the activation signal from the control circuit.

The technologies and methods of this disclosure have been described with reference to several example embodiments. However, changes and modifications may be made to the example embodiments without departing from the scope of the technologies and methods set forth. For example, while an example embodiment may describe a few examples of drone nodes, one of skill in the art will understand the system may be accomplished with other such drone nodes capable of performing similar functions. In addition, while specific details such as operating voltages have been provided to aid in understanding, one of skill in the art will understand that the technologies and methods of this disclosure are not limited to such specifications. These and other changes or modifications are intended to fall within the scope of this disclosure and the attached claims.

What is claimed is:

1. A sensor device, comprising:
a first sensor pin connected to a system bus;
a current supply circuit connected to the first sensor pin, the current supply circuit configured to generate a first current based on a second current received through the first sensor pin;
a second sensor pin connected to the system bus and a transmit circuit;
a control circuit connected to the first sensor pin and the current supply circuit by a sensor bus and connected to the second sensor pin and the transmit circuit;
a third sensor pin connected to a circuit ground by a first capacitor, the first capacitor having a capacitor voltage level;
a voltage detection circuit connected to the third sensor pin, the voltage detection circuit configured to detect a voltage at the third sensor pin corresponding to the capacitor voltage level and to transmit an under-voltage signal to the control circuit when the voltage at the third sensor pin falls below a predetermined level;
a clamp circuit connected to the current supply circuit and one or more other sensor circuits by the sensor bus, the clamp circuit configured to transmit an overcurrent signal to the control circuit when the first current exceeds a current drawn by the one or more other sensor circuits by a predetermined amount and configured to transmit an undercurrent signal to the control circuit when the first current does not exceed the current drawn by the one or more other sensor circuits; and
a low power mode circuit connected to the control circuit by the sensor bus and connected to a CTANK capacitor by a fourth sensor pin, the CTANK capacitor connected to the system bus and circuit ground, wherein the low power mode circuit is configured to sink current from the CTANK capacitor when the low power mode circuit receives an activation signal from the control circuit and to stop sinking current from the CTANK capacitor when the low power mode circuit receives a deactivation signal from control circuit, wherein the control circuit is configured to transmit the activation signal to the low power mode circuit when the control circuit has received the under-voltage signal for a first predetermined length of time.

2. The sensor device of claim 1, wherein the control circuit is configured cause at least one of the one or more other sensor circuits to pause operation when the control circuit has received the under-voltage signal for the first predetermined length of time.

3. The sensor device of claim 2, wherein the control circuit is further configured to cause the transmit circuit to stop transmitting when the control circuit has received the under-voltage signal for the first predetermined length of time.

4. The sensor device of claim 2, wherein the control circuit is further configured to transmit the deactivation signal to the low power mode circuit when the control circuit has received the overcurrent signal from the clamp circuit for a second predetermined length of time.

5. The sensor device of claim 4, wherein the control circuit is further configured to cause the at least one of the one or more other sensor circuits to resume operation when the control circuit has received the overcurrent signal from the clamp circuit for the second predetermined length of time.

6. The sensor device of claim 1, wherein the control circuit is configured to cause at least one of the one or more other sensor circuits to pause operation when the control circuit has received the under-voltage signal for the first predetermined length of time and received the undercurrent signal for a second predetermined length of time.

7. The sensor device of claim 6, wherein the control circuit is further configured to cause the transmit circuit to stop transmitting when the control circuit has received the under-voltage signal for the first predetermined length of time and received the undercurrent signal for the second predetermined length of time.

8. The sensor device of claim 6, wherein the control circuit is further configured to transmit the deactivation signal to the low power mode circuit when the control circuit has received the overcurrent signal from the clamp circuit for the second predetermined length of time.

9. The sensor device of claim 8, wherein the control circuit is further configured to cause the at least one of the or more other sensor circuits to resume operation when the control circuit has received the overcurrent signal from the clamp circuit for the second predetermined length of time.

10. A sensory network, comprising:
a master device; and
a sensor connected to the master device by a system bus, wherein the master device is configured to provide a supply current over the system bus to power the sensor communicate with the sensor over the system bus by modulating the supply current, and wherein sensor is configured to communicate with the master device over the system bus using voltage modulated signals, and wherein the sensor comprises:
a first sensor pin connected to the system bus;
a current supply circuit connected to the first sensor pin, the current supply circuit configured to generate a first current based on the supply current received from the master device through the first sensor pin;
a second sensor pin connected to the system bus and a transmit circuit;
a control circuit connected to the first sensor pin and the current supply circuit by a sensor bus and connected to the second sensor pin and the transmit circuit;
a third sensor pin connected to a circuit ground by a first capacitor, the first capacitor having a capacitor voltage level;
a voltage detection circuit connected to the third sensor pin, the voltage detection circuit configured to detect a voltage at the third sensor pin corresponding to the capacitor voltage level and to transmit an under-voltage signal to the control circuit when the voltage at the third sensor pin falls below a predetermined level;
a clamp circuit connected to the current supply circuit and one or more other sensor circuits by the sensor bus, the clamp circuit configured to transmit an overcurrent signal to the control circuit when the first current exceeds a current drawn by the one or more other sensor circuits by a predetermined amount and configured to transmit an undercurrent signal to the control circuit when the first current does not exceed the current drawn by the one or more other sensor circuits; and
a low power mode circuit connected to the control circuit by the sensor bus and connected to a CTANK capacitor by a fourth sensor pin, the CTANK capacitor connected to the system bus and circuit ground, wherein the low power mode circuit is configured to sink current from the CTANK capacitor when the low power mode circuit receives an activation signal from the control circuit and to stop sinking current from the CTANK capacitor when the low power mode circuit receives a deactivation signal from control circuit,
wherein the control circuit is configured to transmit the activation signal to the low power mode circuit when the control circuit has received the under-voltage signal for a first predetermined length of time.

11. The sensory network of claim 10, wherein the control circuit is configured to cause at least one of the one or more other sensor circuits to pause transmission of voltage modulated signals to the master device when the control circuit has received the under-voltage signal for the first predetermined length of time.

12. The sensory network of claim 11, wherein the control circuit is further configured to cause the transmit circuit to stop transmitting when the control circuit has received the under-voltage signal for the first predetermined length of time.

13. The sensory network of claim 11, wherein the control circuit is further configured to transmit the deactivation signal to the low power mode circuit when the control circuit has received the overcurrent signal from the clamp circuit for a second predetermined length of time.

14. The sensory network of claim 13, wherein the control circuit is further configured to cause the at least one of the one or more other sensor circuits to resume transmission of voltage modulated signals to the master device when the control circuit has received the overcurrent signal from the clamp circuit for the second predetermined length of time.

15. The sensory network of claim 10, wherein the control circuit is configured to cause at least one of the one or more other sensor circuits to pause when the control circuit has received the under-voltage signal for the first predetermined length of time and received the undercurrent signal for a second predetermined length of time.

16. The sensory network of claim 15, wherein the control circuit is further configured to cause the transmit circuit to stop transmitting when the control circuit has received the under-voltage signal for the first predetermined length of time and received the undercurrent signal for the second predetermined length of time.

17. The sensory network of claim 15, wherein the control circuit is further configured to transmit the deactivation signal to the low power mode circuit when the control circuit has received the overcurrent signal from the clamp circuit for the second predetermined length of time.

18. A method of managing power consumption in a sensor device, comprising:
generating a first current using a current supply circuit, the first current based on a second current received through a system bus;
detecting a voltage at a sensor pin of the sensor device using a voltage detection circuit, the voltage at the sensor pin corresponding to a capacitor voltage level of a first capacitor;
transmitting an under-voltage signal to a control circuit using the voltage detection circuit when the voltage at the sensor pin falls below a predetermined level;
using a clamp circuit connected to the current supply circuit and one or more other sensor circuits by a sensor bus, the clamp circuit transmitting an overcurrent signal to the control circuit when the first current exceeds a current drawn by the one or more other sensor circuits by a predetermined amount and transmitting an undercurrent signal to the control circuit when the first current does not exceed the current drawn by the one or more other sensor circuits;

transmitting, using the control circuit, an activation signal to a low power mode circuit when the control circuit has received the under-voltage signal for a first predetermined length of time; and sinking current from a CTANK capacitor to power the sensor device, using the low power mode circuit, when the low power mode circuit receives the activation signal from the control circuit.

19. The method of claim 18, further comprising causing, using the control circuit, at least one circuit of the sensor device to pause operation when the control circuit has received the under-voltage signal for the first predetermined length of time.

20. The method of claim 19, further comprising causing, using the control circuit, a transmit circuit of the sensor device to stop transmitting when the control circuit has received the under-voltage signal for the first predetermined length of time.

21. The method of claim 18, further comprising deactivating the low power mode circuit when the control circuit has received the overcurrent signal for a second predetermined length of time.

* * * * *